(12) United States Patent
Oo

(10) Patent No.: US 8,354,865 B1
(45) Date of Patent: *Jan. 15, 2013

(54) METHOD AND APPARATUS FOR SAMPLING

(75) Inventor: Kenneth Thet Zin Oo, Milpitas, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 13/248,659

(22) Filed: Sep. 29, 2011

Related U.S. Application Data

(63) Continuation of application No. 12/552,684, filed on Sep. 2, 2009, now Pat. No. 8,030,974.

(60) Provisional application No. 61/095,774, filed on Sep. 10, 2008.

(51) Int. Cl.
 *G11C 27/02* (2006.01)
 *H03K 5/00* (2006.01)
 *H03K 17/00* (2006.01)

(52) U.S. Cl. ........................................................ 327/94

(58) Field of Classification Search .................. 327/536, 327/91–97; 363/59–60
See application file for complete search history.

(56) References Cited

U.S. PATENT DOCUMENTS

| | | | |
|---|---|---|---|
| 5,463,285 A * | 10/1995 | El-Hamamsy | 315/248 |
| 6,052,000 A * | 4/2000 | Nagaraj | 327/94 |
| 6,696,883 B1 | 2/2004 | Wilson | |
| 7,183,814 B2 | 2/2007 | Kudo | |
| 7,274,222 B2 | 9/2007 | Alacoque et al. | |
| 7,710,164 B1 | 5/2010 | Sharma | |

OTHER PUBLICATIONS

U.S. Appl. No. 12/552,543, filed Sep. 2, 2009.

* cited by examiner

*Primary Examiner* — Quan Tra

(57) ABSTRACT

A sampling circuit can include a switch having a control terminal, a first channel terminal and a second channel terminal. The first channel terminal can be configured to receive an input signal, and the control terminal can be configured to have a control voltage that varies with regard to the input signal, such that a conducting channel can be formed between the first channel terminal and the second channel terminal to enable an output voltage on the second channel terminal to track the input signal. Further, the sampling circuit can include a bootstrap module coupled to the control terminal of the switch. The bootstrap module can be configured to change the control voltage by a substantially constant value to turn off the conducting channel between the first channel terminal and the second channel terminal in order to hold the output voltage as a sample of the input signal.

20 Claims, 4 Drawing Sheets

METHOD AND APPARATUS FOR SAMPLING

INCORPORATION BY REFERENCE

This application is a continuation of U.S. application Ser. No. 12/552,684, filed Sep. 2, 2009, which claims priority under 35 U.S.C. §119(e) to U.S. Provisional Application No. 61/095,774, filed Sep. 10, 2008. The disclosures of the applications referenced above are incorporated herein by reference.

BACKGROUND

Sampling circuits can be used in integrated circuits for various purposes. For example, a sampling circuit may be used in an analog to digital converter (ADC) module. The sampling circuit may acquire an analog value, and hold the analog value for other portions of the ADC module to convert the analog value to a digital value. Generally, a sampling circuit may introduce sampling distortions due to various non-idealities, such as variable on-resistance, channel charge depletion, sampling aperture jitter, clock feed-through, data feed-through, and the like. The sampling distortions may affect, for example, a resolution of the ADC module.

SUMMARY

Aspects of the disclosure can provide a sampling circuit having reduced sampling distortions. The sampling circuit can include a switch having a control terminal, a first channel terminal and a second channel terminal. The first channel terminal can be configured to receive an input signal, and the control terminal can be configured to have a control voltage that varies with regard to the input signal, such that a conducting channel can be formed between the first channel terminal and the second channel terminal to enable an output voltage on the second channel terminal to track the input signal. Further, the sampling circuit can include a first bootstrap module coupled to the control terminal of the switch. The first bootstrap module can be configured to change the control voltage by a substantially constant value to turn off the conducting channel between the first channel terminal and the second channel terminal in order to hold the output voltage as a sample of the input signal.

Further, the first bootstrap module can be configured to couple the control terminal of the switch with a node receiving a sampling clock signal. Thus, the first bootstrap module can change the control voltage by the substantially constant value at a sampling instant of the sampling clock signal.

More specifically, the first bootstrap module can include a capacitor that couples the control terminal of the switch and the node receiving the sampling clock signal. Further, the first bootstrap module can include a reset switch configured to reset the control voltage on the control terminal.

In an embodiment, the sampling circuit can include a second bootstrap module configured to couple the control terminal and the first channel terminal of the switch in order to vary the control voltage with regard to the input signal. Further, the second bootstrap module can be configured to vary the control voltage with a substantially constant voltage difference to the input signal.

According to an aspect of the disclosure, the switch can include at least one of an n-type metal oxide semiconductor (MOS) transistor and a p-type MOS transistor.

Aspects of the disclosure can also provide a method for sampling. The method can include receiving an input signal at a first channel terminal of a switch, and varying a control voltage on a control terminal of the switch with regard to the input signal to maintain the switch having a conducting channel between the first channel terminal and a second channel terminal of the switch. Thus, an output voltage on the second channel terminal of the switch can track the input signal. Additionally, the method can include changing the control voltage by a substantially constant value to turn off the conducting channel of the switch in order to hold the output voltage on the second channel terminal as a sample of the input signal.

To vary the control voltage on the control terminal of the switch with regard to the input signal, the method can include maintaining a voltage difference between the control voltage on the control terminal and the input signal on the first channel terminal at a substantially constant level.

To maintain the voltage difference between the control voltage on the control terminal and the input signal on the first channel terminal at the substantially constant level, the method can include charging a capacitor to have the voltage difference at the substantially constant level between a first terminal and a second terminal of the capacitor, and coupling the first terminal and the second terminal of the capacitor to the control terminal and the first channel terminal of the switch respectively.

To change the control voltage with the substantially constant value to turn off the conducting channel of the switch, the method can include coupling a node with the substantially constant value of voltage change to the control terminal via a capacitor. Further, the method can include driving the node with a sampling clock signal.

According to an aspect of the disclosure, the method can include resetting the control voltage to a constant value.

Aspects of the disclosure can provide an integrated circuit (IC) chip. The IC chip can include a driving module configured to drive an input signal, an analog to digital converter configured to convert samples of the input signal into digital values, and a sampling circuit configured to receive the input signal, sample the input signal with regard to sampling instants of a sampling clock signal, and provide samples to the analog to digital converter. The sampling circuit can include a switch having a control terminal, a first channel terminal and a second channel terminal. The first channel terminal can be configured to receive the input signal. The control terminal can be configured to have a control voltage that varies with regard to the input signal for maintaining a conducting channel between the first channel terminal and the second channel terminal to enable an output voltage on the second channel terminal to track the input signal. The sampling circuit can also include a first bootstrap module coupled to the control terminal of the switch. The first bootstrap module can be configured to change the control voltage by a substantially constant value to turn off the conducting channel between the first channel terminal and the second channel terminal in order to hold the output voltage as a sample of the input signal.

BRIEF DESCRIPTION OF THE DRAWINGS

Various exemplary embodiments of this disclosure will be described in detail with reference to the following figures, wherein like numerals reference like elements, and wherein.

DETAILED DESCRIPTION OF EMBODIMENTS

Figure 1:
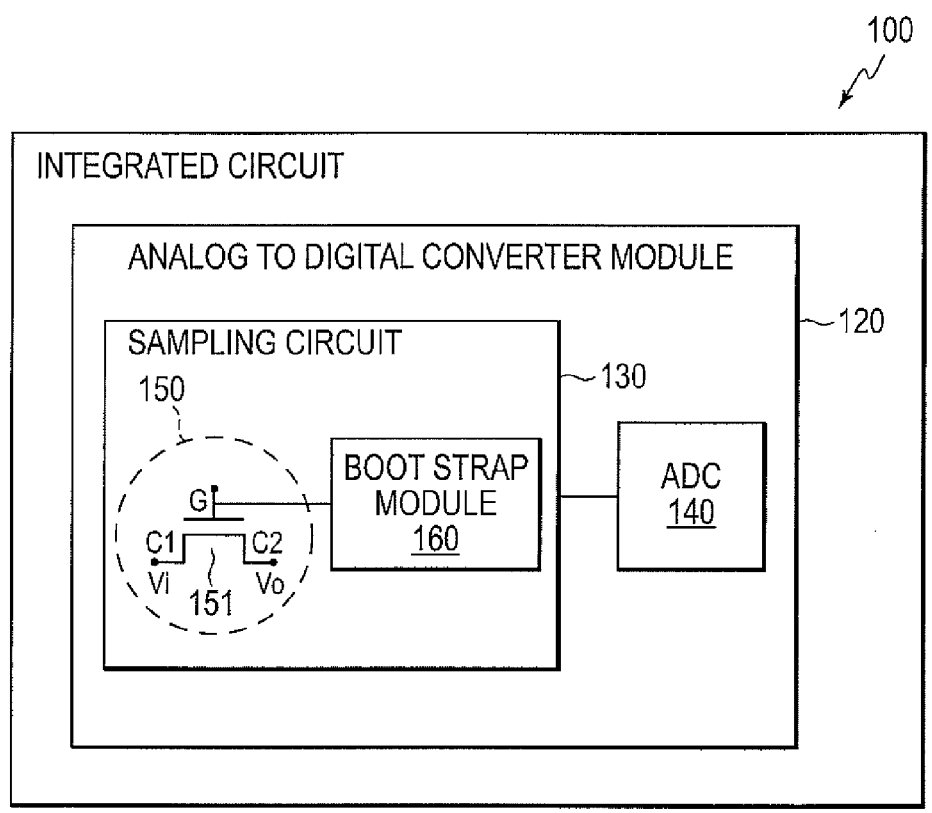
FIG. 1 shows a block diagram of an exemplary integrated circuit (IC) chip.

FIG. 1 shows a block diagram of an exemplary integrated circuit (IC) chip. The IC chip 100 can include a sampling circuit 130, for example, as a portion of an analog to digital converter module 120. The analog to digital converter module 120 may include an analog to digital converter 140 coupled to the sampling circuit 130. The analog to digital converter 140 may receive a sampled analog value from the sampling circuit 130, and convert the sampled analog value to digital values. According to the disclosure, the sampling circuit 130 can be configured to have reduced sampling distortions, thus the analog to digital converter module 120 may have an increased resolution. The sampling circuit 130 may include a switch module 150 and a bootstrap module 160 coupled together as shown in FIG. 1.

The switch module 150 can include one or more transistors of any suitable types, such as n-type metal oxide semiconductor field effect transistor (MOSFET), p-type MOSFET, and the like. In addition, the one or more transistors may be configured in various manners. In an example, the switch module 150 may include a single n-type or p-type MOS transistor configured as a single-transistor switch module. In another example, the switch module 150 may include an n-type MOS transistor and a p-type MOS transistor coupled together to form a transmission-gate-type switch module. In another example, the switch module 150 may include two n-type MOS transistors, or two p-type MOS transistors that can be configured in a differential manner to form a differential-type switch module. It is noted that the present disclosure describes methods and circuits with a switch module example having a single n-type MOS transistor for ease and clarity, the methods and circuits can be suitably adjusted for use in other types of switch modules.

In the FIG. 1 example, the switch module 150 can include an n-type MOS transistor 151. The n-type MOS transistor 151 can include a gate terminal G, a first channel terminal C1, and a second channel terminal C2. The n-type MOS transistor 151 can be configured into a track-mode or a hold-mode by controlling a gate voltage on the gate terminal G. More specifically, the first channel terminal C1 may receive an input signal Vi that can be driven by any suitable driving circuits, and the second channel terminal C2 may output a voltage Vo depending on which mode the n-type MOS transistor 151 has been configured by the gate voltage on the gate terminal G.

In the FIG. 1 example, when the gate voltage on the gate terminal G satisfies a channel forming condition, for example, the gate voltage being higher than a voltage on the first terminal C1 or a voltage on the second terminal C2 by at least a threshold voltage of the n-type MOS transistor 151, a conducting channel can be turned on between the first channel terminal C1 and the second channel terminal C2, and the n-type MOS transistor 151 is configured in the track mode. In the track mode, the output voltage Vo on the second channel terminal C2 may track the input signal Vi received at the first channel terminal C1, such that the output voltage Vo can follow changes of the input signal Vi.

In an embodiment, the gate voltage on the gate terminal G may be configured to change with regard to the input signal Vi. For example, the gate voltage on the gate terminal G may have a substantially constant voltage difference to the input signal. The substantially constant voltage difference can enable substantially constant amount of channel charges in the conducting channel. The substantially constant amount of channel charges can facilitate a reduction of a sampling distortion due to channel charge dissipation.

On the other hand, when the gate voltage on the gate terminal G does not satisfy the channel forming condition, for example, the gate voltage not being higher than voltages on the first channel terminal C1 and the second channel terminal C2 by the threshold voltage of the n-type MOS transistor 151, the channel between the first terminal C1 and the second channel terminal C2 can be turned off, and the n-type MOS transistor 151 can be configured in the hold mode. In the hold mode, the output voltage Vo on the second channel terminal C2 can maintain a substantially same value acquired from the input signal Vi at a sampling instant, at which the gate voltage of the gate terminal G changes, for example, from satisfying the channel forming condition to not-satisfying the channel forming condition.

The bootstrap module 160 can be coupled to the switch module 150, for example, by coupling to the gate terminal of the n-type MOS transistor 151. According to the disclosure, the bootstrap module 160 can be configured to cause a substantially constant voltage change on the gate terminal G at the sampling instant. In an embodiment, the bootstrap module 160 may include a capacitor coupled between the gate terminal G and a node receiving a sampling clock signal. The sampling clock signal may include an edge, such as a voltage change from Vdd to zero, which defines the sampling instant. Thus, at the sampling instant, the capacitor can couple the voltage change to the gate terminal G, and result in a voltage change of Vdd on the gate terminal G at the sampling instant.

According to an embodiment, the substantially constant voltage change may facilitate reductions of sampling distortions. Sampling distortions can be caused due to various non-idealities, such as variable on-resistance, channel charge depletion, sampling aperture jitter, clock feed-through, data feed-through, and the like. In an example, the n-type MOS transistor 151 can be designed to have an increased width to obtain an increased bandwidth for high-speed applications. However, the increased width can increase an amount of channel charges. In addition, the increased width can increase parasitic overlap and routing capacitances formed between the gate terminal G and the second channel terminal C2, due to manufacturing process.

The increased amount of channel charges may increase a sampling distortion due to channel charge dissipation. The sampling distortion due to the channel charge dissipation can be input signal dependent. In order to reduce the sampling distortion, the gate voltage at the gate terminal G can be configured to vary with the input signal Vi by a substantially constant voltage difference. Thus, the amount of channel charges for dissipation at the sampling instant can be substantially constant. The substantially constant amount of channel charges can facilitate a reduction of the sampling distortion, for example, by using a differential configuration. In addition, the substantially constant voltage difference may result in a substantially constant on-resistance. The substantially constant on-resistance can reduce a sampling distortion caused by variable on-resistance.

However, the gate voltage varying with the input signal may increase another type of sampling distortion. The other type of sampling distortion can be referenced as clock-feed-through, and is caused by the parasitic overlap and routing capacitances between the gate terminal G and the second channel terminal C2. As stated, the parasitic overlap and routing capacitances can be increased due to the increased width. Thus, when the gate voltage changes, for example, at the sampling instant, the parasitic overlap and routing capacitances can couple an increased portion of the gate voltage change to the second channel terminal C2, due to an increased capacitance ratio of the parasitic overlap and routing capacitances to a sampling capacitance at the second channel terminal C2. Therefore, the output voltage Vo at the second channel terminal C2 may have an increased clock-feed-through type of sampling distortion.

According to an embodiment, the clock-feed-through type of sampling distortion can be reduced by the gate voltage changing substantially constantly at the sampling instant. When the gate voltage change is substantially constant, the sampling distortion can be cancelled by suitably configuring the switch module 150.

In an example, the switch module 150 may be configured in a differential manner by including another n-type MOS transistor (not shown). The other n-type MOS transistor can be configured, for example, to have substantially the same parasitic overlap and routing capacitances between its gate terminal and its second channel terminal, and to have substantially the same constant voltage change on its gate terminal at the sampling instant. However, the other n-type MOS transistor may be configured to receive a differential version of the input signal Vi. Thus, the sampling distortion, specifically the clock feed through error, caused by the substantially constant voltage change on the gate terminals of the two n-type MOS transistors can be cancelled by a different output voltage of the two n-type MOS transistors.

Figure 2:
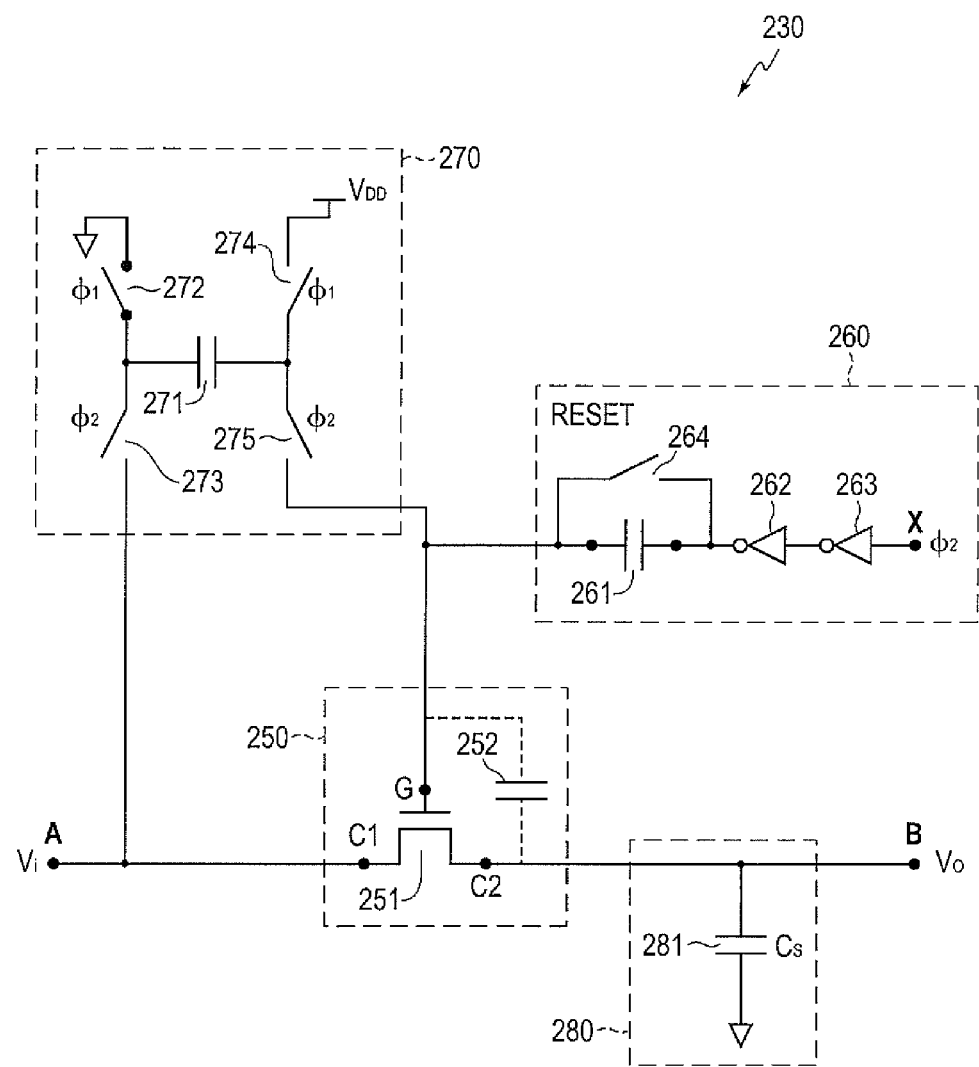
FIG. 2 shows a block diagram of an exemplary sampling circuit.

FIG. 2 shows a block diagram of an exemplary sampling circuit. The sampling circuit 230 can include a switch module 250, a sampling capacitor module 280, a first bootstrap module 270, and a second bootstrap module 260. These elements can be coupled as shown in FIG. 2.

The switch module 250 can include an n-type MOS transistor 251. The n-type MOS transistor 251 can include a gate terminal G, a first channel terminal C1 and a second channel terminal C2. The first channel terminal C1 can be coupled to a node A for receiving an input signal Vi. The input signal Vi can be driven by any suitable driving circuits. The second channel terminal C2 can be coupled to a node B for outputting a signal Vo. The gate terminal G can be used to configure the n-type MOS transistor 251 into a track mode or a hold mode. In the track mode, the output signal Vo can track the input signal Vi; and in the hold mode, the output signal Vo can hold a sample of the input signal Vi acquired at a sampling instant. It is noted that the n-type MOS transistor 251 has parasitic overlap and routing capacitances between the gate terminal G and the second channel terminal C2. The parasitic overlap and routing capacitances are represented by a capacitor symbol 252 in FIG. 2.

The sampling capacitor module 280 can include any suitable circuits that can be configured to hold a sample. In an example, the sampling capacitor module 280 can include a sampling capacitor Cs 281 coupled between the node B and ground.

The first bootstrap module 270 can be coupled between the gate terminal G and the first channel terminal C1 of the n-type MOS transistor 251. The first bootstrap module 270 can be configured to maintain a substantial constant voltage difference between the gate terminal G and the first channel terminal C1, for example, during the track mode.

In an example, the first bootstrap module 270 can include a capacitor 271, a first switch 272, a second switch 273, a third switch 274, a fourth switch 275 coupled together as shown in FIG. 2. The first switch 272 and the third switch 274 can be controlled to switch on or switch off in response to a first clock signal $\phi 1$. For example, when the first clock signal $\phi 1$ is logic "1", the first switch 272 and the third switch 274 can be switched on, and then the capacitor 271 can be coupled to a charger, as shown by Vdd and ground in FIG. 2, to be charged to a substantially constant voltage.

The second switch 273 and the fourth switch 275 can be controlled to switch on or switch off in response to a second clock signal $\phi 2$. For example, when the second clock signal $\phi 2$ is logic "1", the second switch 273 and the fourth switch 275 can be switched on, and then the capacitor 271 can be coupled to the n-type MOS transistor 251.

In the FIG. 2 example, the n-type MOS transistor 251 can be configured into the track mode or the hold mode based on the second clock signal $\phi 2$. For example, when the second clock signal $\phi 2$ is logic "0", the n-type MOS transistor 251 can be configured into the hold mode; when the second clock signal is logic "1", the n-type MOS transistor 251 can be configured into the track mode; and when the second clock signal $\phi 2$ changes from logic "1" to logic "0", the n-type MOS transistor 251 can be configured to have a sampling instant.

The first clock signal $\phi 1$ can be non-overlapped with the second clock signal $\phi 2$, and can work with the second clock signal $\phi 2$ to control the first bootstrap module 270. More specifically, when the first clock signal $\phi 1$ is logic "1", and the second clock signal $\phi 2$ is logic "0", the first switch 272 and third switch 274 can be switched on and the second switch 273 and the fourth switch 275 can be switched off. Thus, the capacitor 271 can be coupled to the charger. The charger can charge the capacitor 271 to have the substantially constant voltage difference, for example, Vdd, between a first terminal and a second terminal of the capacitor 271.

On the other hand, when the second clock signal $\phi 2$ is logic "1", and the first clock signal $\phi 1$ is logic "0", the first switch 272 and third switch 274 can be switched off and the second switch 273 and the fourth switch 275 can be switched on. Thus, the capacitor 271 can be coupled to the n-type MOS transistor 251. Thus, the substantially constant voltage difference, for example, Vdd, can be applied to the first channel terminal C1 and the gate terminal G of the n-type MOS transistor 251. As a result, the n-type MOS transistor 251 can be configured into the track mode, and have a conducting channel between the first channel terminal C1 and the second channel terminal C2. Further, the output signal Vo on the second channel terminal C2 can follow changes of the input signal Vi on the first channel terminal C1. Additionally, when the input signal Vi on the first channel terminal C1 varies, the gate voltage on the gate terminal G can vary accordingly due to the coupling of the capacitor 271.

The second bootstrap module 260 can be coupled to the gate terminal G of the n-type MOS transistor 251, and can include any suitable circuits that can be configured to cause a substantial constant voltage change on the gate terminal G of the n-type MOS transistor 251 at a sampling instant.

In an example, the second bootstrap module 260 can include a capacitor 261, an inverter chain, which may include a first inverter 262 and a second inverter 263, and a reset switch 264, coupled together as shown in FIG. 2.

The capacitor 261 and the inverter chain may serially couple the gate terminal G of the n-type MOS transistor 251 with a node X. The node X may receive the second clock signal $\phi 2$. When the second clock signal $\phi 2$ has voltage changes, for example, from zero to Vdd, or from Vdd to zero. The voltage changes can be coupled to the gate terminal G via the inverter chain and the capacitor 261.

The reset switch 264 may be coupled with the capacitor 261 in parallel. The reset switch 264 can be controlled by a reset signal RESET. The reset signal RESET may include pulses. Each pulse can turn on the reset switch 264 to discharge the capacitor 261.

Operations of the sampling circuit 230 can be controlled by suitably configuring the first clock signal φ1, the second clock signal φ2, and the reset signal RESET. The operations can be described in detail with regard to FIG. 3.

Figure 3:
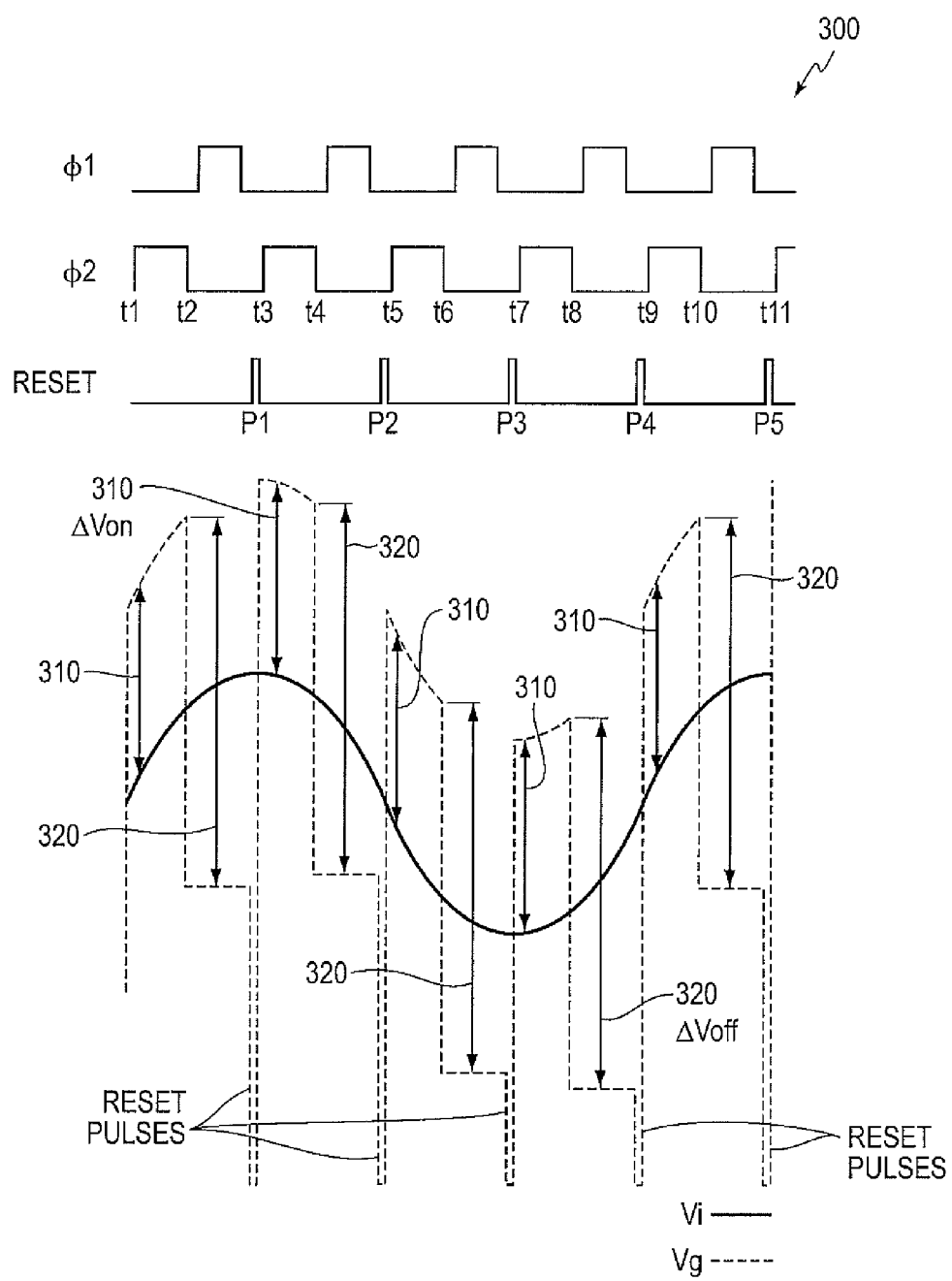
FIG. 3 shows a plot of exemplary waveforms for the exemplary sampling circuit in FIG. 2.

FIG. 3 shows a plot of exemplary waveforms for the sampling circuit 230 in FIG. 2. The plot 300 includes waveforms for the first clock signal φ1, the second clock signal φ2, the reset signal RESET, the input signal Vi and the gate voltage Vg.

The second clock signal φ2 can control the operation modes of the n-type MOS transistor 251. When the second clock signal φ2 is logic "1", the n-type MOS transistor 251 can be configured in the track mode. When the second clock signal φ2 changes from logic "1" to logic "0", the n-type MOS transistor 251 can have a sampling instant to acquire a sample of the input signal Vi. When the second clock signal φ2 is logic "0", the n-type MOS transistor 251 can be configured in the hold mode to hold the sample acquired at the sampling instant.

The first clock signal φ1 can control the sampling circuit 230 to recharge the capacitor 271. The reset signal RESET can control the reset switch 264 to discharge the capacitor 261.

During operation, when the second clock signal φ2 changes from logic "0" to logic "1", as shown at t1, t3, t5, t7 and t9, the second switch 273 and the fourth switch 275 can be switched on, and the capacitor 271 can be coupled to the first channel terminal C1 and the gate terminal G. Further, charges on the capacitor 271 can result in a substantially constant voltage difference, as shown by ΔVon 310, between the gate voltage Vg on the gate terminal G and the input signal Vi on the first channel terminal C1. The substantially constant voltage difference can be suitably configured to be larger than the threshold voltage of the n-type MOS transistor 251, thus the n-type MOS transistor 251 can be turned on and the conducting channel can be formed between the first channel terminal C1 and the second channel terminal C2. Therefore, the n-type MOS transistor 251 can be configured in the track mode.

Additionally, the second clock signal φ2 can improve a turn-on speed of the re-type MOS transistor 251 via the second bootstrap module 260. In the second bootstrap module 260, the capacitor 261 can couple the second clock signal 432 to the gate terminal G. Thus, when the second clock signal φ2 changes from logic "0" to logic "1", a voltage increase can be coupled to the gate terminal G by the capacitor 261. The voltage increase coupled to the gate terminal G can improve the turn-on speed of the n-type MOS transistor 251.

When the second clock signal φ2 changes from logic "1" to logic "0", as shown by t2, t4, t6, t8 and t10, the n-type MOS transistor 251 can be configured to have a sampling instant to acquire a sample of the input signal Vi. According to the disclosure, the second bootstrap module 260 can result in a substantially constant voltage change, as shown by ΔVoff 320 in FIG. 3, on the gate terminal G of the n-type MOS transistor 251 at the sampling instants. For example, the inverter 262 can be configured to output from Vdd to zero in response to the second clock signal φ2 changing from logic "1" to logic "0". When the output voltage of the inverter 262 changes from Vdd to zero, the voltage decrease of Vdd can be coupled to the gate terminal G, and the gate voltage Vg can be reduced by Vdd to turn off the conducting channel between the first channel terminal C1 and the second channel terminal C2.

While the second clock signal φ2 stays in the logic "0", the first clock signal φ1 can change from logic "0" to logic "1" to control the first switch 272 and the third switch 274 to couple the capacitor 271 to the charger for recharging. Then, while the second clock signal φ2 still stays in the logic "0", the first clock signal φ1 can change from logic "1" to logic "0" to control the first switch 272 and the third switch 274 to decouple the capacitor 271 from the charger. In addition, while the second clock signal φ2 stays in the logic "0", the reset signal RESET can provide pulses, as shown by P1-P5 in FIG. 3. The pulses can control the reset switch 264 to discharge the capacitor 261, and reset the voltage on the gate terminal G to a constant value, such as zero, as shown by reset pulses in FIG. 3.

Figure 4:
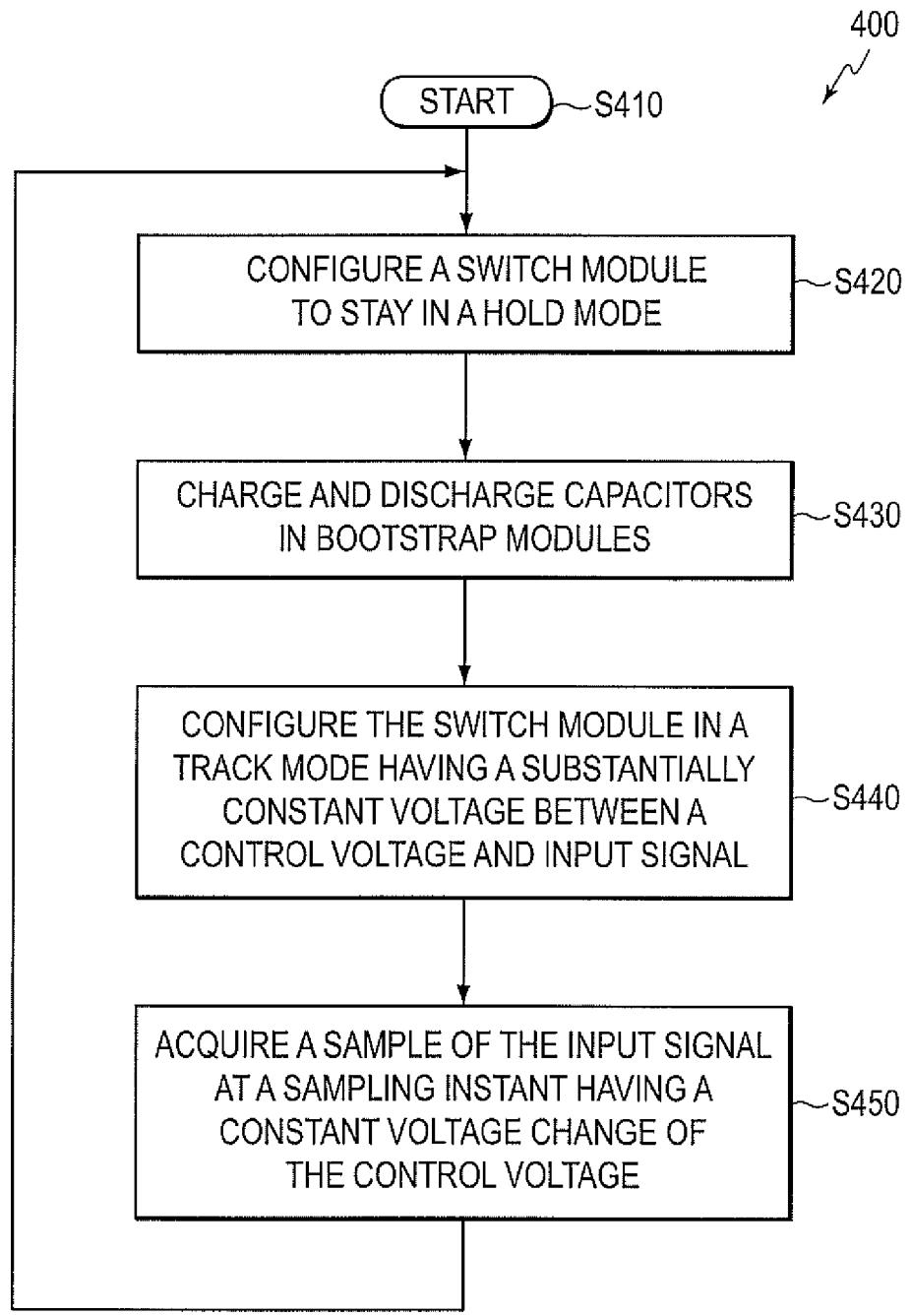
FIG. 4 shows a flow chart outlining an exemplary sampling process.

FIG. 4 shows a flow chart outlining an exemplary sampling process. The process 400 starts from step S410, and proceeds to step S420.

In step S420, a switch module can be configured to stay in a hold mode. In the example of FIG. 2, the n-type MOS transistor 251 can be configured to stay in the hold mode by the second clock signal φ2 staying at logic "0". The second clock signal φ2 staying at logic "0" can decouple the capacitor 271 from the n-type MOS transistor 251. Then, the process proceeds to step S430.

In step S430, the switch module may charge and discharge capacitors in various bootstrap modules. In the FIG. 2 example, the capacitor 271 in the first bootstrap module 270 can be charged to a substantially constant voltage by having the first clock signal φ1 be logic "1" for a duration while the second clock signal φ2 stays at logic "0". In addition, the capacitor 261 in the second bootstrap module 260 can be discharged by the reset signal RESET. Then, the process proceeds to step S440.

In step S440, the switch module can be configured into a track mode having a substantially constant voltage difference between a control voltage and an input signal. In the FIG. 2 example, the capacitor 271 can be coupled to the n-type MOS transistor 251 by switching the second clock signal φ2 from logic "0" to logic "1". The capacitor 271 can maintain the gate voltage on the gate terminal G having the substantially constant voltage difference to the input signal on the first terminal C1. The substantially constant voltage difference can be suitably configured to satisfy the channel forming condition of the n-type MOS transistor 251. Therefore, a conducting channel with substantially constant channel charges can be formed between the first channel terminal C1 and the second channel terminal C2, and the output voltage Vo on the second channel terminal C2 can follow changes of the input signal Vi on the first channel terminal C1. Then the process proceeds to step S450.

In step S450, the switch module can be configured to acquire a sample of the input signal at a sampling instant having a substantially constant voltage change of the control voltage. In the FIG. 2 example, the capacitor 261 in the second bootstrap module 260 can couple a constant voltage change to the gate terminal G in response to the second clock signal φ2 changing from logic "1" to logic "0". Thus, the gate voltage can change substantially constantly at the sampling instant. In an embodiment, the substantially constant voltage change may result in a sampling distortion that can be reduced by differentially configuring the switch module. Then, the process returns to step S420 to repetitively execute the sampling process.

While the invention has been described in conjunction with the specific exemplary embodiments thereof, it is evident that many alternatives, modifications, and variations will be apparent to those skilled in the art. Accordingly, exemplary embodiments of the invention as set forth herein are intended to be illustrative, not limiting. There are changes that may be made without departing from the spirit and scope of the invention.

What is claimed is:

1. A sampling circuit, comprising:
    a switch configured to receive an input signal and track the input signal with a control voltage that varies with regard to the input signal;
    a first bootstrap module coupled to the switch, the first bootstrap module configured to hold an output voltage of the switch as a sample of the input signal; and
    a second bootstrap module including a capacitor and a chain of inverters serially coupled to the switch, wherein the capacitor is directly coupled to a gate of the switch.

2. The sampling circuit of claim 1, wherein the switch has a control terminal, a first channel terminal and a second channel terminal, the first channel terminal being configured to receive the input signal, and the control terminal having the control voltage for maintaining a conducting channel between the first channel terminal and the second channel terminal to enable the output voltage on the second channel terminal to track the input signal.

3. The sampling circuit of claim 1, wherein the first bootstrap module is coupled to a control terminal of the switch, the first bootstrap module being configured to change the control voltage of the control terminal to hold the output voltage.

4. The sampling circuit of claim 3, wherein the first bootstrap module changes the control voltage by a substantially constant value to turn off a conducting channel between a first channel terminal and a second channel terminal of the switch.

5. The sampling circuit of claim 4, wherein the first bootstrap module is further configured to change the control voltage at a sampling instant of a sampling clock signal.

6. The sampling circuit of claim 5, when the capacitor is a second capacitor, wherein the first bootstrap module further comprises a first capacitor that couples the control terminal and a node receiving the sampling clock signal.

7. The sampling circuit of claim 1, further comprising:
    a reset switch configured to reset the control voltage.

8. The sampling circuit of claim 7, wherein the reset switch is coupled with the capacitor in parallel.

9. The sampling circuit of claim 2, wherein the second bootstrap module is coupled to the control terminal.

10. The sampling circuit of claim 9, wherein the second bootstrap module is further configured to vary the control voltage by a substantially constant value.

11. The sampling circuit of claim 10, wherein the substantially constant value is a substantially constant voltage difference between the control voltage and the input signal.

12. A method for sampling, comprising:
    receiving an input signal at a first channel terminal of a switch;
    tracking the input signal with a control voltage of the switch, the control voltage varying with regard to the input signal;
    holding an output voltage of the switch as a sample of the input signal; and
    charging or discharging a capacitor serially coupled to a chain of inverters and the switch, wherein the capacitor is directly coupled to a gate of the switch.

13. The method of claim 12, wherein tracking the input signal further comprises:
    varying the control voltage on a control terminal of the switch to maintain the switch having a conducting channel between a first channel terminal and a second channel terminal of the switch, and cause an output voltage on the second channel terminal of the switch to track the input signal.

14. The method of claim 12, wherein holding the output voltage further comprises:
    changing the control voltage by a substantially constant value to turn off a conducting channel of the switch in order to hold the output voltage on a second channel terminal as a sample of the input signal.

15. The method of claim 12, wherein the capacitor is serially coupled to a control terminal of the switch.

16. The method of claim 13, wherein varying the control voltage on the control terminal further comprises:
    maintaining a voltage difference between the control voltage on the control terminal and the input signal on the first channel terminal at a substantially constant level.

17. The method of claim 16, when the capacitor is a second capacitor, wherein maintaining the voltage difference further comprises:
    charging a first capacitor to have the voltage difference at the substantially constant level between a first terminal and a second terminal of the first capacitor; and
    coupling the first terminal and the second terminal of the first capacitor to the control terminal and the first channel terminal of the switch respectively.

18. The method of claim 16, when the capacitor is a second capacitor, wherein maintaining the voltage difference, further comprises:
    coupling a node having the voltage difference to the control terminal via a first capacitor.

19. The method of claim 18, further comprising:
    driving the node with a sampling clock signal.

20. The method of claim 12, further comprising:
    resetting the control voltage to a constant value.

* * * * *